United States Patent [19]

Zarowin et al.

[11] Patent Number: 5,336,355

[45] Date of Patent: Aug. 9, 1994

[54] METHODS AND APPARATUS FOR CONFINEMENT OF A PLASMA ETCH REGION FOR PRECISION SHAPING OF SURFACES OF SUBSTANCES AND FILMS

[75] Inventors: Charles B. Zarowin, Rowayton; L. David Bollinger, Ridgefield, both of Conn.

[73] Assignee: Hughes Aircraft Company, Los Angeles, Calif.

[21] Appl. No.: 807,535

[22] Filed: Dec. 13, 1991

[51] Int. Cl.$^5$ .............................................. H01L 21/00
[52] U.S. Cl. ..................... 156/345; 156/643; 118/723 R; 219/121.36; 219/121.4; 313/231.31; 315/111.21
[58] Field of Search ............... 156/643, 345; 118/723; 427/569, 446, 34, 294; 219/121.36, 121.4, 0.47, 0.48; 313/231.31, 231.51, 231.61; 315/111.21, 111.71

[56] References Cited

U.S. PATENT DOCUMENTS

| | | | |
|---|---|---|---|
| 4,088,926 | 5/1978 | Fletcher et al. | 315/111.21 |
| 4,461,954 | 7/1984 | Inoue | 219/121.4 |
| 4,668,366 | 5/1987 | Zarowin | 204/298.32 |
| 4,853,250 | 8/1989 | Boulos et al. | 427/446 |
| 4,859,908 | 8/1989 | Yoshida et al. | 118/723 |
| 5,000,771 | 3/1991 | Fleming et al. | 156/643 |
| 5,144,196 | 9/1992 | Gegenwart et al. | 315/111.21 |

FOREIGN PATENT DOCUMENTS 61-139029  6/1986  Japan .

OTHER PUBLICATIONS

"A Theory of Plasma-Assisted Chemical Vapor Transport & Processes" J. Appl. Phys. 57(3), Feb. 1, 1985; Zarowin.

"Relation Between the RF Discharge Parameters & Plasma Etch Rates: Selectivity, & Anisotropy"; J. Vac. Sci. Technology. A2(4), Oct.-Dec. 1984, pp. 1537-1549 Zarowin.

"Rapid, nonmechanical, damage—Free Figuring of Optical Surfaces using plasma-assisted chemical etching (PACE)"; Parts I-II SPIE vol. 966 Advances in Fabrication and Metrology for Optics and Large Optics (1988); pp. 82-97—Bollinger, et al.

"Predicted Polishing Behavior of Plasma Assisted Chemical Etching (PACE) from a Unified Model of the Temporal Evolution of Etched Surfaces"; SPIE vol. 966 in Fabrication & Metrology for Optics & Large Optics (1988) pp. 98-107, Gallatin, et al.

"Rapid, Non-Contact Damage Free Shaping of Optical & Other Surfaces w/Plasma Assisted Chemical Etching" Proceedings of the 43rd Annual Symposium on Frequency Control (1989); IEEE PG 623-626 Zarowin, et al.

"Unified Approach to the Temporal Evolution of Surface Profiles in Solid Etch & Deposition Processes"; J. Appl. Phys. 65(12), Jun. 15, 1989; pp. 5078-5088.

List continued on next page

*Primary Examiner*—Brian E. Hearn
*Assistant Examiner*—George Goudreua
*Attorney, Agent, or Firm*—Michael W. Sales; W. K. Denson-Low

[57] ABSTRACT

A reactor 10 having a vacuum housing 30 which encloses a plasma chamber 14 is used to perform local plasma assisted chemical etching on an etchable substrate 12. The chamber 14 is movable and is sized according to the removal material footprint desired. An rf driven electrode 22 and rf driven gas diffuser 22 have the same diameter as the chamber 14. The substrate 12 is mounted on a substrate holder 44 which also acts as the other electrode. The holder 44 is mounted on an X-Y positioning table 46. A reactive gas is flowed into the chamber with rf power so as to break the reactive gas into a plasma. The plasma chamber 14 which locally confines the plasma may be scanned over the substrate surface while the gap between the chamber and the substrate is varied to yield a desired etch profile.

11 Claims, 3 Drawing Sheets

OTHER PUBLICATIONS

"Review of Precision Surface Generating Processes & their Potential Application to the Fabrication of Large Optical Components" SPIE vol. 966 (1988) Stowers, et al.

"Rapid, Non-Contact Optical Figuring of Asphoric Surfaces w/ Plasma Assisted Chemical Etching" (PACE); SPIE 1333 (1990).

"Rapid Optical Figuring of Aspherical Surfaces w/ Plasma Assisted Chemical Etching (PACE)"; SPIE vol. 1618; Large Optics II (1991); pp. 14-21; Bollinger, et al.

"A comparison using Surface Evolution Theory of the Smoothing and figuring of Optics by Plasma Assisted Chemical Etching & Ion Milling"; SPIE vol. 1618 Large Optics II (1991); pp. 22-27; Zarowin.

"Predicted Polishing of Plasma Assisted Chemical Etching" (PACE) From a Unified Model of the Temporal Evolution of Etched Surfaces SPIE vol. 966; pp. 98-107; Gallatin et al.

"Localized Plasma Etching For Device Optimization"; Larson et al.; J. Vac. Sci. 10(1); Feb. 1992; pp. 27-29 (1992).

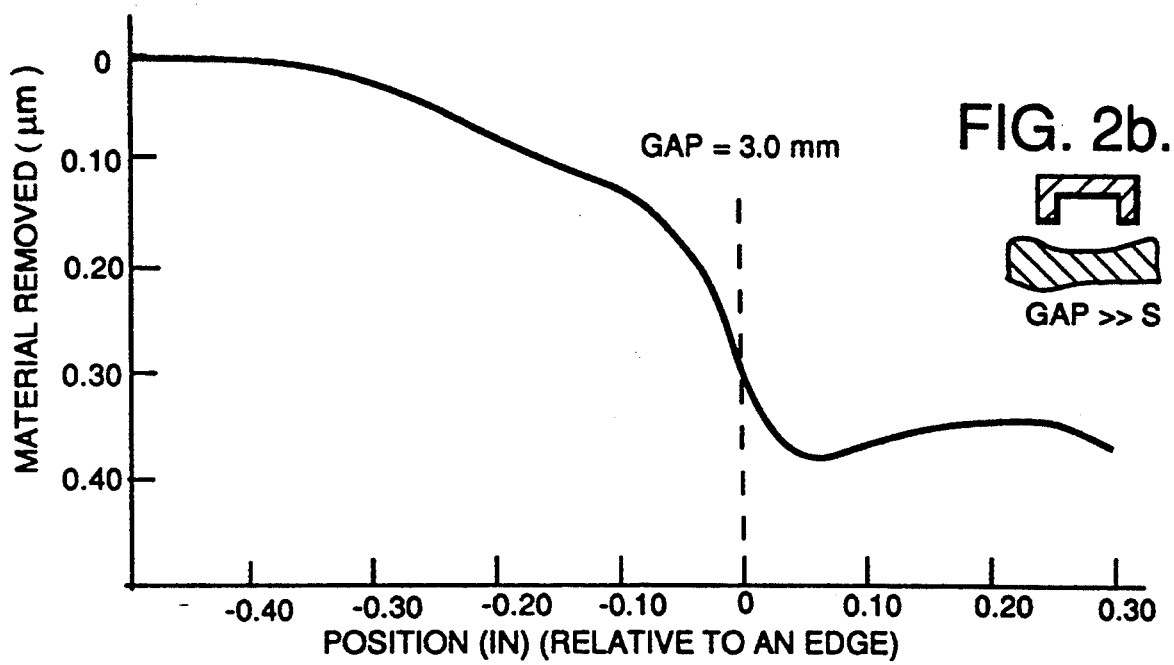
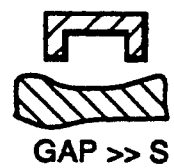
FIG. 2a.
FIG. 2b.
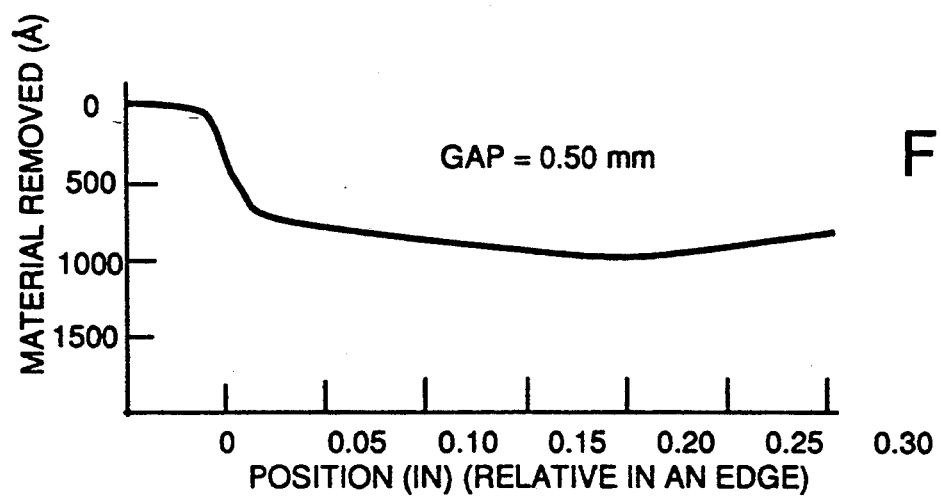
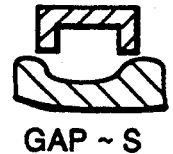
FIG. 3a.
FIG. 3b.

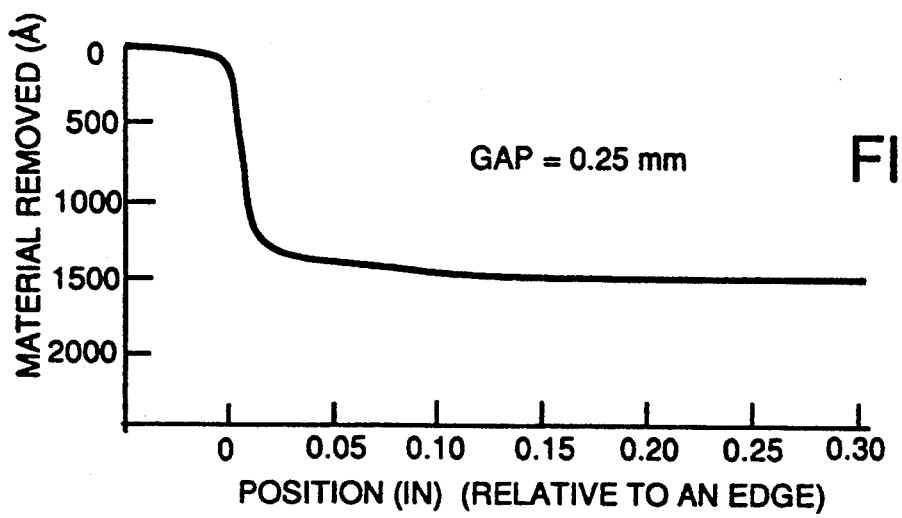
FIG. 4a.
FIG. 4b.
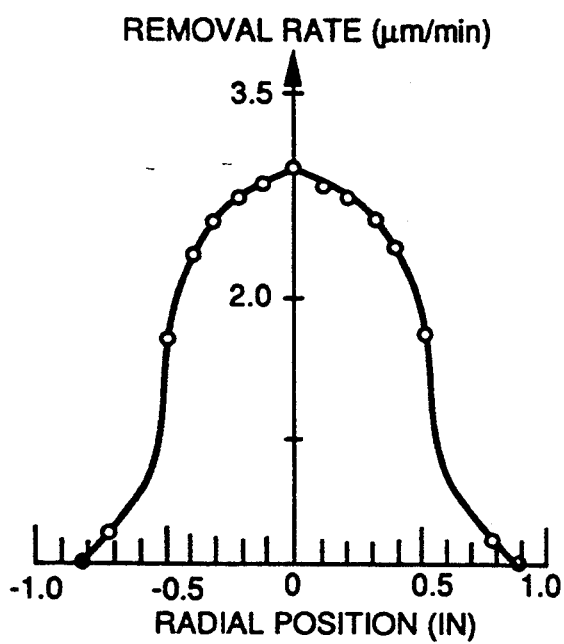
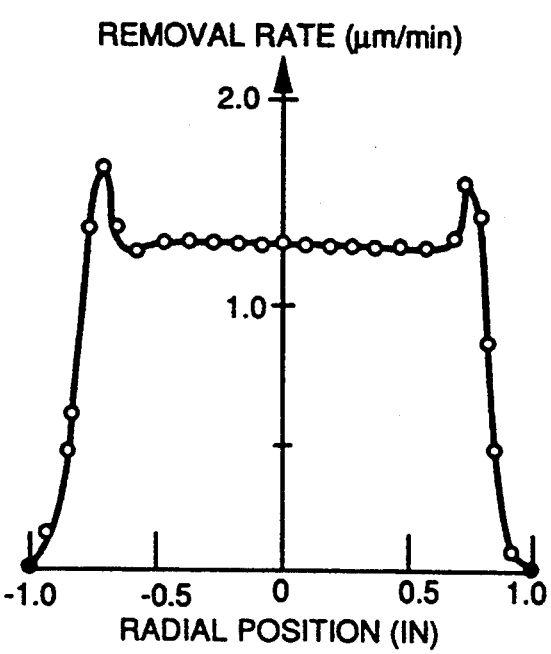
FIG. 5a.
|  | (a) | (b) |
|---|---|---|
| GAS | $SF_5$ | $CF_4$ |
| PRESS | 3.0 TORR | 2.1 TORR |
| RF POWER | 200 W | 100 W |
| RF FREQ. | 13.56 MHz | 400 KHz |
SUBSTRATE: 100mm SI WAFER WITH 1μm GLASS
FIG. 5b.
FIG. 5c.

METHODS AND APPARATUS FOR CONFINEMENT OF A PLASMA ETCH REGION FOR PRECISION SHAPING OF SURFACES OF SUBSTANCES AND FILMS

BACKGROUND OF THE INVENTION

1. Field of the Invention

The present invention relates to a method and apparatus for confining a radio frequency (rf) excited plasma and, more particularly, to a method and apparatus for confining an rf excited plasma to a localized, well defined area of an etchable substrate so that non-uniformities in the substrate surface may be corrected. The present invention provides a means for shaping a substrate surface with great precision. It is particularly suitable for forming thin, uniform substrate layers.

2. Description of the Prior Art

Conventional processes for shaping surfaces of substrates and, more particularly, for thinning and figuring surfaces and films, such as silicon-on-insulator (SOI), often employ such methods as mechanical polishing, grinding, sputtering, sand blasting and ion beam bombarding. Each of these prior art processes usually have substantial processing limitations. Chemomechanical processes such as thinning, polishing and flattening, are contact methods which leave contaminants that can cause subsurface damage to a substrate. Plasma assisted chemical etching methods have improved upon prior art processes such as chemomechanical thinning because such plasma processes are non-contact, thus reducing the potential for subsurface damage. Furthermore, chemomechanical processes have limited capability to correct the thickness profile of a film because the ability to change the film profile is determined by the flatness of the underlying surface. The plasma processes of the present invention, on the other hand, can locally remove material depending on the measured film thickness at that point without contacting the substrate. Thus, a non-contact etching method such as plasma etching reduces the potential for subsurface damage of the substrate.

For optical figuring, plasma assisted chemical etching processes are superior to conventional, mechanical methods because aspherical surfaces may be figured as easily as spherical surfaces; removal rates can be high so that figure generation as well as final figure error correction can be readily achieved; material removal is non-contact and does not create subsurface damage; and surface roughness is smoothed with material removal. Methods of figuring by plasma assisted chemical etching, and more particularly optical figuring, are disclosed in U.S. Pat. No. 4,668,366. This patent discloses a method and apparatus for figuring a surface by plasma assisted chemical transport by means of mounting the surface to processed on an electrode of a parallel plate rf driven reactor. The method disclosed passes a reactive gas through a chamber where an rf field is present. The method controls the removal rates of different areas of the surface by moving a relatively small surface area electrode over the surface to be processed. The time the small electrode spends at each region affects the etching of the surface at that region. However, as will be seen later, the apparatus and method of this invention lacks a means to precisely control the profile or shape of the material removal footprint. Such a means is necessary when precise error correction of surfaces is desired. The present invention provides a means to control the profile of the material removal footprint.

SUMMARY OF THE INVENTION

The present invention is directed to a method and apparatus for figuring and thinning a surface by precisely confining a radio frequency (rf) excited plasma to a localized, well-defined area of a substrate. The method and apparatus of the present invention provides a means for precisely confining the plasma to a local area of a substrate so that: there is no physical contact with the substrate by the plasma delivery means; the substrate material removed by plasma etching can occur at high rates; the substrate material removal rates and spatial removal shape are highly controllable and predictable; and the confined plasma can be moved over the entire surface of the substrate.

Precise confinement of the rf excited plasma is accomplished by: restricting the application region of the field; restricting the reactive gas pressure to a region in which a given peak rf field permits only local plasma breakdown; choosing the constituent(s) of the reactive gas so that the diffusion of electrons supporting the discharge are locally restricted; and/or idling the region in which no discharge is desired with a solid insulator.

Production of repeatable etch rates, spatial distributions and other etch characteristics by precise confinement of the rf excited plasma of the present invention provides a useful non-contact material removal tool that can be employed as an optical figuring tool, film thickness profiling tool, or a precision flattening and smoothing tool. The present invention provides a means for figuring high quality optical surfaces, including aspheric surfaces which are difficult to fabricate by conventional methods. The present invention also provides a means of fabricating silicon-on-insulator (SOI) wafers and structures, and a means for preparing uniform, flat, smooth and damage free substrates for semiconductor device fabrication.

One objective of the present invention is to provide a means for confining an rf excited plasma to a well defined area.

Another objective of the present invention is to provide a non-contact material removal tool that can be precisely scanned over a substrate surface.

Another objective of the present invention is to provide a means of controlling the characteristics of an etch process so as to avoid subsurface damage.

Another objective of the present invention is to provide a means for optical figuring.

Another objective of the present invention is to provide a means for thinning and controlling the thickness profile of films.

Another objective of the present invention is to provide a means for precision flattening and smoothing of a substrate surface.

Other objects and advantages of the present invention will become apparent to those skilled in the art from the following detailed description read in conjunction with the attached drawings and claims appended hereto.

DESCRIPTION OF THE DRAWINGS

FIGS. 2a, 2b shows an etch profile for an etching made when the gap between the substrate and the plasma chamber is greater than the plasma sheath width.

FIGS. 3a, 3b, shows an etch profile for an etching made when the gap between the substrate and the plasma chamber is approximately equal to the plasma sheath width.

FIGS. 4a, 4b shows an etch profile for an etching made when the gap between the substrate and the plasma chamber is less than the plasma sheath width.

FIGS. 5a, 5b, 5c shows a comparison of etch profiles when different plasma etching characteristics are used with the present invention.

DETAILED DESCRIPTION OF THE PRESENT INVENTION

Figure 1:
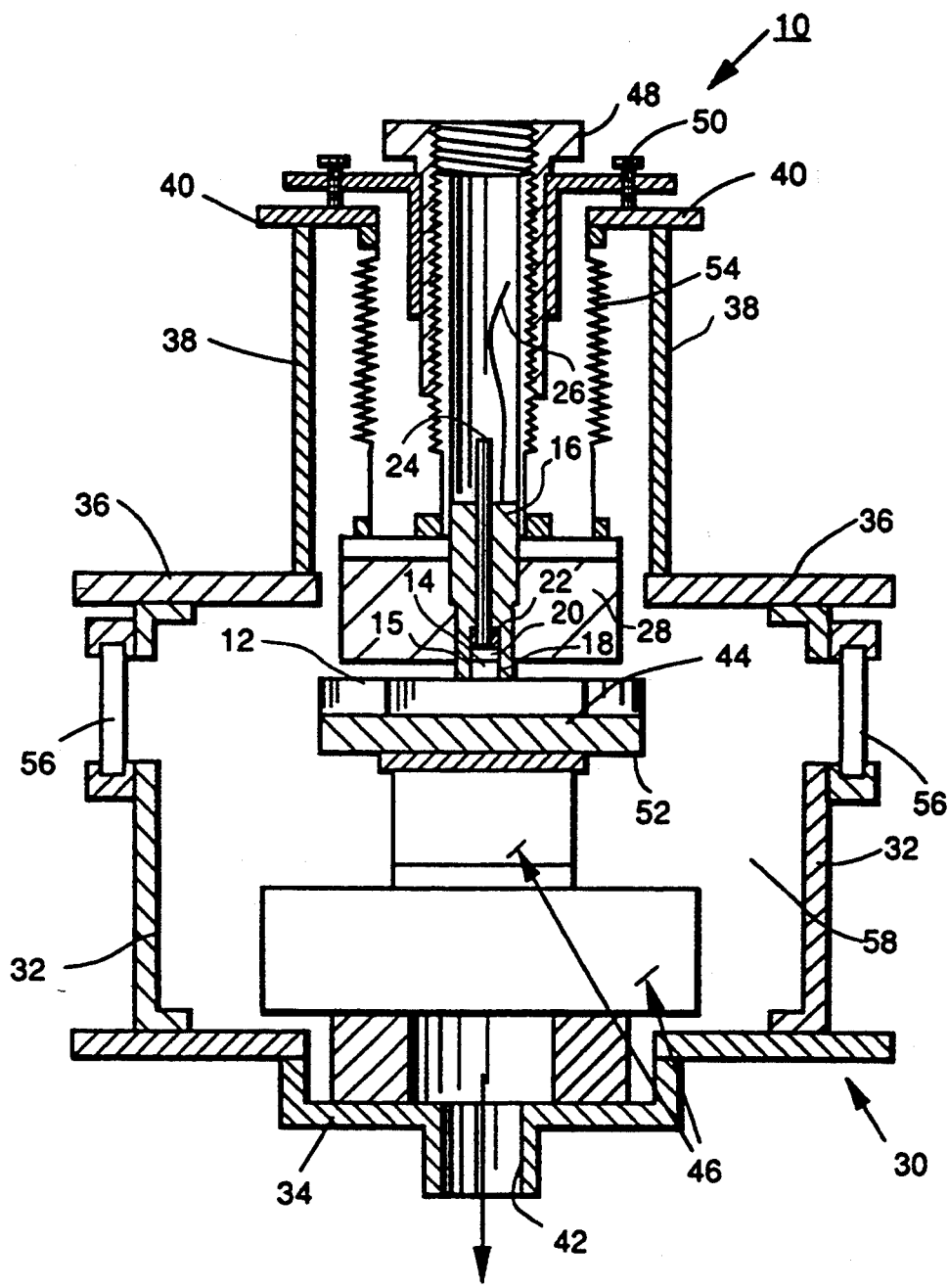
FIG. 1 is a schematic diagram of a reactor system capable of confining a plasma etch region to a local area on a substrate.

The present invention provides a non-contact etchable material removal tool for shaping the surface of an etchable substrate. Referring to FIG. 1, an apparatus for confining a plasma etch region over a substrate comprises a reactor 10 designed for transporting a reactive gas into a region over the surface of a substrate where an rf field is applied. To accomplish this desired result, the reactor 10 has a plasma cavity 14 having walls 15 defined by a first dielectric insulator 16 and a ceiling 18 defined by a reactive gas diffuser 20. The plasma cavity 14 is the center of etching reactivity and thus, the first dielectric must be a non-contaminating material. Above the cavity 14, an rf driven electrode 22 is affixed between the diffuser 18 and the first insulator 16. A reactive gas feed tube 24 running centrally through the first dielectric insulator 16 supplies reactive gas to the diffuser 20 in the plasma cavity 14 during the etching operation. An rf inlet conductor 26 connects the rf driven electrode 22 to an rf field power source. A second dielectric insulator 28 surrounds the first insulator 16 and is fashioned of sufficient dimensions so as to essentially cover substrate 12 so as to prevent plasma formation outside of cavity 14. The components of the reactor 10, are enclosed in a vacuum housing 30 comprising a first set of walls 32 extending from a base 34 to a mid-ceiling 36 and a second set of walls 38 extending to a top ceiling flange 40.

During operation, a vacuum is applied through a vacuum outlet 42 at the bottom of the vacuum housing 30. The etchable substrate 12, located adjacently below the plasma cavity 14 during etching, is supported by a substrate holder 44 which also acts as a second electrode having its potential preferably at electrical ground.

The substrate holder 44 is mounted to an X-Y positioning table 46 which allows precise placement of the localized etching reaction on the surface of the substrate 12. The reactor 10 has means 48 for adjusting the distance between the plasma cavity 14 and the surface of the substrate 12. The reactor also has means 50 to adjust the angle of the terminal end 52 of the plasma chamber with respect to the surface of the substrate 12. While the embodiment described above provides a means for positioning the plasma cavity 14 with respect to the surface of the substrate 12, other adaptations such as permanently fixing the plasma chamber assembly and providing multi-dimensional positioning of the substrate could be readily substituted.

A bellows 54 attached between the ceiling flange 40 of the vacuum housing 36 and the second dielectric insulator 28 provides a means for vacuum sealing the reactor 10 while the plasma chamber assembly is allowed relative movement within the reactor. A plurality of viewports 56 are provided for observation of the reaction.

The basic etching operation of a plasma assisted chemical etching reactor 10 has been described above in Zarowin, U.S. Pat. No. 4,668,366. However, that patent does not disclose a means to confine a plasma locally to the surface of the substrate so that the profile of the material removal may be controlled.

Confinement of the plasma etching to a local region by the present invention may be accomplished by restricting the region of application of rf electric fields; restricting the reactive gas pressure to a region in which given peak rf field permits only local plasma breakdown; choosing the constituent(s) of the reactive gas so that the diffusion of electrons supporting the discharge are locally restricted; and/or filling the reactor volume with a solid insulator wherever no discharge is desired. The reactor 10 shown in FIG. 1 is designed so that it may be adapted to use one or more of these different confining techniques.

Confinement of the plasma etch region by rf electric field restriction is established to by feeding the rf energy into a region sufficiently well surrounded by an insulative enclosure. Referring to FIG. 1, the insulative enclosure is a plasma cavity 14 fashioned so as to have an opening when placed proximate to the etching surface characteristic of the confined plasma removal tool size needed to make required "error" corrections to the substrate 12. To generate a plasma, the depth of the plasma cavity 14 must be significantly greater than a Debye length. The plasma regime investigated with the present invention has a Debye length on the order of 1 mm. During the etching operation, a gap is maintained between the terminal end 52 of the plasma chamber and the substrate 12. The terminal end 52 of the plasma cavity 14 never contacts the substrate 12. In practice, the gap can be varied between 0.25 and 10 mm.

Further restriction of the rf electric fields may be made by appropriately limiting the size of the rf driven electrode 22 and rf driven diffuser 20. Use of a small electrode with a diameter approximately equal to the diameter of the plasma cavity 14 effectively achieves a confined and intense local plasma at the surface where plasma etching is to be performed. It is important to limit the size of the electrode 22, or any electrically conductive extension of it, so that it does not extend beyond the plasma chamber walls 15. The rf driven gas diffuser 20, located adjacently below the electrode 22, is also limited in size so as not to extend beyond the walls 15 because the diffuser is made of a material that is conductive and porous and, thus, is part of the rf circuit. The diffuser has two functions. First, it functions to diffuse reactive gas into the plasma chamber, and second, it functions as an extension of the rf electrode to apply the rf excitation field to the interior of the plasma cavity 14. Among others, porous silicon carbide and graphite electrodes have been successfully employed as diffuser materials.

In addition to appropriate sizing of the cavity 14, and limiting the size of the rf electrode 22 and diffuser 20, the rf field can be restricted by the use of additional dielectric materials. In addition to the first dielectric insulator 16 used as the walls 15 of the plasma cavity 14, the second dielectric insulator 28 is placed in the reactor 10 so that it surrounds the first insulator 16 and essentially covers the entire surface of the substrate 12. The second dielectric insulator 28 primarily fills the reactor volume in regions where no plasma discharge is desired with a solid insulator. This volume filling within the reactor by the second insulator 28 has two effects. First, the insulator excludes reactive gas from the region in which no plasma discharge is desired, namely the area adjacent to the footprint of the local plasma etching region, and second, the insulator provides a very high impedance path to all electrically conductive surfaces relative to the etching path (the path between the rf driven electrode 22, the substrate 12 at the local plasma region, and the substrate holding electrode 44), thus, restricting the region of application of the rf field and plasma to where etching is desired. This local plasma generation insures that the removal tool footprint is precise.

In a preferred embodiment of the present invention, the plasma chamber has a diameter of ½ inch. However, the diameter of the chamber may be varied to accommodate a removal tool footprint size necessary to perform the desired error correction.

The plasma etch region may also be locally confined by restricting the reactive gas pressure to the region where the rf field permits only local plasma breakdown. This may be accomplished by feeding the reactive gas into the reactive gas feed tube 24 which channels the reactive gas directly to the interior of the plasma cavity 14 via the diffuser 20. The reactive gas exits the plasma chamber and etching site through a higher flow impedance region defined by the opening between the terminal end 52 of the plasma chamber and the substrate surface, into a low flow impedance region 58. The low flow impedance region 58 is pumped out by a vacuum pump (not shown) so that the pressure outside of the plasma cavity 14 is much lower than the pressure inside the chamber. After the rf discharge is initiated, the plasma region provides a lower impedance path and, thus, prevents the etching reaction outside of the footprint area.

By carefully choosing the constituent(s) of the reactive gasses so that the diffusion of electrons supporting the discharge are locally restricted, the etching region may be further confined. A gas with greater electronegativity attaches free electrons more rapidly than a gas with less electronegativity. The use of more electronegative gas reduces the number and the mobility of free electrons available for etching, thereby reducing their mean energy, and thus reducing the potential for reaction outside the plasma cavity 14.

As mentioned earlier, the gap between the plasma 14 and the substrate 12 can be varied by several means. For many applications, it is not possible to maintain a gap which is less than a plasma Debye length, a length that prevents the plasma from diffusing out of the chamber region. Thus, by using a highly electronegative reactive gas, the plasma may be confined for high etch rates and gaps larger than a Debye length (approximately 2 mm). In some applications a small percentage of an electronegative gas (approximately 5%) can be sufficient to provide a well confined plasma. Sulfur hexafluoride and nitrogen trifluoride are known electronegative gases which have sufficient electronegativity and are thus useful for confining the plasma etching region.

Thus, by applying the above principles for confining the plasma etch region, controlled local etching can be employed to make programmed corrections to a substrate surface by localized plasma material removal. Programmed corrections are made by moving the position of the substrate area to be corrected under the plasma cavity 14. Movement of the substrate 12 in orthogonal directions relative to the chamber is accomplished by moving the X-Y positioning table 46 accordingly. Referring to FIGS. 2a, 2b, 3a, 3b, 4a and 4b material removal profile may be changed by varying the gap be the cavity 14 and the substrate. When the gap is small, such as 0.5 mm, the profile tends to have edges extending vertically into a floor. The radius of curvature of the profile at the point where the edges are connected to the floor cannot be less than the order of the Debye length due to physical limitations of the plasma. When the gap is large, such as 3 mm, a more gaussian-like profile can be maintained. Referring to FIG. 5a, 5b, and 5c for a given set of plasma parameters (reactive rf frequency, rf power, pressure and reactive gas constituents) and a given gap, the material removal profile can be controlled and is very repeatable.

Thus, it can be appreciated that the present invention provides a means for precision shaping of a substrate. The invention is ideally adapted for aspheric surfaces which are difficult to fabricate by conventional methods. This invention further provides a novel means for fabricating SOI wafers and structures, and for preparing any or all of the following uniform, thin, flat, smooth and damage free crystalline substrates for various types of semiconductor device fabrication.

What is claimed is:

1. A material removal tool for performing confined plasma assisted chemical etching reactions on the surface of a substrate comprising a reactor having:
   a housing:
   a first dielectric insulator positioned within the housing for defining a plasma chamber cavity for performing a local plasma etching reaction about a localized region of a substrate;
   means for supplying the plasma chamber with a flow of reactive gas;
   means for providing the reactive gas within the plasma chamber with rf power so as to generate a plasma therein;
   a second dielectric insulator positioned within the housing and around the first dielectric insulator, said second dielectric insulator extending outward from the first dielectric insulator such that extinction of any plasma outside the plasma chamber cavity is facilitated, said first dielectric insulator extending a preselected distance beyond said second dielectric insulator proximate the substrate surface such that a region of high plasma and low reactive gas flow conductance circumferentially adjacent to a site where plasma etching is occurring is created;
   means for supporting the substrate; and
   means for adjusting the position of said plasma chamber cavity with respect to said substrate surface.

2. The material removal tool of claim 1, wherein the means for supplying rf power includes a first electrode positioned within the plasma chamber cavity, an electrically conductive rf gas diffuser, and a second electrode positioned outside the plasma chamber cavity so that the substrate is positioned between the first and second electrodes so as to complete an electrical circuit for supplying rf power to the reactive gas within the plasma chamber cavity.

3. The material removal tool of claim 2, wherein the first electrode includes upper and lower surfaces, the upper surface being positioned in contact with the ceiling surface of the plasma chamber cavity; and the rf gas diffuser includes an upper and lower surface and is positioned so that the upper surface of the gas diffuser being in contact with the lower surface of the first electrode.

4. The material removal tool of claim 3, wherein the upper and lower surface areas of the first electrode having approximately the same area and approximately the same planar geometry as the surface of the ceiling of the plasma chamber cavity.

5. The material removal tool of claim 3, wherein the upper and lower surface areas of the electrically conductive gas diffuser have approximately the same area and approximately the same planar geometry as the surface of the ceiling of the plasma chamber cavity.

6. The material removal tool of claim 2, wherein the second electrode is maintained at substantially at ground potential.

7. The material removal tool of claim 2, wherein the electrically conductive gas diffuser is fabricated from porous silicon carbide.

8. The material removal tool of claim 2, wherein the electrically conductive gas diffuser is fabricated from graphite.

9. The material removal tool of claim 1, wherein the means for adjusting the position of said plasma chamber with respect to said substrate surface in the orthogonal direction comprises an x-y positioning table 10. The material removal tool of claim 1, wherein said housing includes means for applying a vacuum to the housing to remove reaction product and excessive reactive gas.

11. A material removal tool for performing confined plasma assisted chemical etching reactions on the surface of a substrate comprising a reactor having:

a housing means for carrying out a local plasma etching reaction including means for controlling the temperature and pressure of the environment within the housing;

a first dielectric insulator positioned with the housing for defining a plasma chamber having a cavity for performing a local plasma etching reaction about a localized region of a substrate;

means for supplying the plasma chamber with a flow of reactive gas including a gas diffuser;

means for providing the reactive gas within the plasma chamber with rf power so as to generate a plasma therein the includes a first electrode positioned within the plasma chamber cavity, an electrically conductive rf gas diffuser, and a second electrode positioned outside the plasma chamber cavity so that the substrate is positioned between the first and second electrodes so as to complete an electrical circuit for supplying rf power to the reactive gas within the plasma chamber cavity;

a second dielectric insulator positioned within the housing and around the first dielectric insulator, said second dielectric insulator extending outward from the first dielectric insulator, and thereby facilitating extinction of any plasma outside the plasma chamber cavity, and extending downward toward the substrate surface a distance shorter than the first dielectric insulator so as to allow the first dielectric insulator to create a region of high plasma and reactive flow impedance circumferentially adjacent to a site where plasma etching is occurring so that plasma outside the region is extinguished;

means for supporting the substrate; and an X-Y positioning table means for adjusting the position of said substrate surface with respect to the plasma chamber in an orthogonal direction.

* * * * *